(12) United States Patent
Cai et al.

(10) Patent No.: US 11,569,144 B2
(45) Date of Patent: Jan. 31, 2023

(54) SEMICONDUCTOR PACKAGE DESIGN FOR SOLDER JOINT RELIABILITY

(71) Applicant: Intel Corporation, Santa Clara, CA (US)

(72) Inventors: Yuhong Cai, Folsom, CA (US); Yi Xu, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 966 days.

(21) Appl. No.: 16/158,049

(22) Filed: Oct. 11, 2018

(65) Prior Publication Data

US 2020/0118901 A1 Apr. 16, 2020

(51) Int. Cl.
*H01L 23/31* (2006.01)
*H01L 25/065* (2006.01)
(Continued)

(52) U.S. Cl.
CPC ...... *H01L 23/3135* (2013.01); *H01L 21/0273* (2013.01); *H01L 21/561* (2013.01); *H01L 21/565* (2013.01); *H01L 21/78* (2013.01); *H01L 23/3128* (2013.01); *H01L 24/48* (2013.01); *H01L 25/0657* (2013.01); *H01L 25/50* (2013.01); *H01L 2224/48091* (2013.01);
(Continued)

(58) Field of Classification Search
CPC ............ H01L 23/3135; H01L 21/0273; H01L 21/561; H01L 21/565; H01L 21/78; H01L 23/3128; H01L 24/48; H01L 25/0657; H01L 25/50; H01L 2224/48091; H01L 2224/48106; H01L 2224/48145; H01L 2224/48225; H01L 2225/06506; H01L 2225/0651; H01L 2225/06562; H01L 2225/06586; H01L 24/29; H01L 24/32; H01L 24/45; H01L 24/73; H01L 2221/68327; H01L 2221/6834; H01L 2224/2919; H01L 2224/32245; H01L 2224/45147; H01L 2924/181; H01L 21/568; H01L 21/6835; H01L 2224/32145; H01L 2224/32225; H01L 2224/48227; H01L 2224/73265; H01L 2224/8592; H01L 2924/15311; H01L 2924/35; H01L 2924/351
USPC .......................................................... 257/777
See application file for complete search history.

(56) References Cited

U.S. PATENT DOCUMENTS

| 9,240,393 B2 * | 1/2016 | Yu .......... H01L 23/3135 |
| 11,069,588 B2 * | 7/2021 | Oh .......... H01L 23/562 |
| 2008/0315379 A1 * | 12/2008 | Kim .......... H01L 23/49558 257/E23.031 |

* cited by examiner

*Primary Examiner* — Vu A Vu
(74) *Attorney, Agent, or Firm* — Schwabe, Williamson & Wyatt, P.C.

(57) ABSTRACT

Embodiments described herein provide techniques for using a stress absorption material to improve solder joint reliability in semiconductor packages and packaged systems. One technique produces a semiconductor package that includes a die on a substrate, where the die has a first surface, a second surface opposite the first surface, and a sidewall surface coupling the first surface to the second surface. The semiconductor package further includes a stress absorption material contacting the sidewall surface of the die and a molding compound separated from the sidewall surface of the die by the stress absorption material. The Young's modulus of the stress absorption material is lower than the Young's modulus of the molding compound. One example of a stress absorption material is a photoresist.

13 Claims, 4 Drawing Sheets

(51) Int. Cl.
  *H01L 25/00* (2006.01)
  *H01L 21/56* (2006.01)
  *H01L 21/78* (2006.01)
  *H01L 21/027* (2006.01)
  *H01L 23/00* (2006.01)
(52) U.S. Cl.
  CPC ............... *H01L 2224/48106* (2013.01); *H01L 2224/48145* (2013.01); *H01L 2224/48225* (2013.01); *H01L 2225/0651* (2013.01); *H01L 2225/06506* (2013.01); *H01L 2225/06562* (2013.01); *H01L 2225/06586* (2013.01)

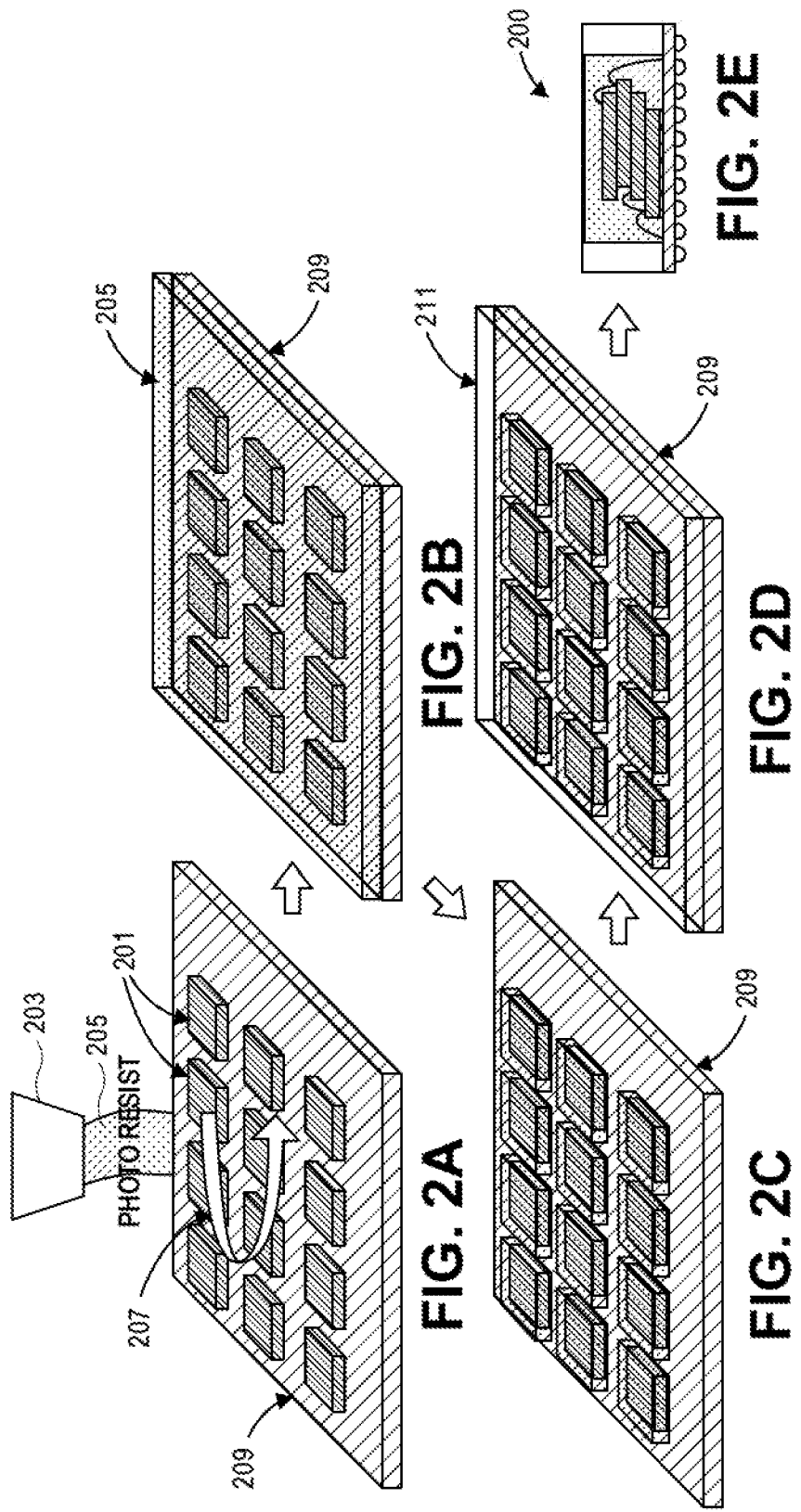

SEMICONDUCTOR PACKAGE DESIGN FOR SOLDER JOINT RELIABILITY

BACKGROUND

Field

Embodiments described herein generally relate to substrates (e.g., semiconductor packages, printed circuit boards (PCB), etc.). More particularly, but not exclusively, embodiments described herein relate to a semiconductor package comprising a stress absorption material.

Background Information

At least one semiconductor package includes: (i) a substrate; (ii) a silicon spacer on the substrate; (iii) a die stack on the silicon spacer, where the die stack comprises multiple dies; (iv) a polyimide layer between the silicon spacer and the die stack; (v) wire bonds coupling the die stack to the substrate; and (vi) a molding compound encapsulating the die stack, the wire bonds, the polyimide layer, and the silicon spacer.

The differing coefficients of thermal expansion (CTEs) of the substrate, the die stack, the polyimide layer, and the molding compound can create stress in the package. That is, such stress is caused by CTE mismatches within the package. The stress can negatively affect an interconnect joint used to couple the package's pad to another device's pad (e.g., another semiconductor package, a printed circuit board (PCB), etc.). The stress alluded to above can cause cracks in the interconnect joint, cratering of the pads, etc. Consequently, interconnect joints need to be designed to absorb stress caused by CTE mismatches.

A silicon spacer is a block of silicon on which a die stack sits. The silicon spacer distributes stress from the middle portion of a package to the edge portion of the package. In this way, interconnect joints in the middle portion of the package are exposed to less stress than interconnect joints at the edge portion. This strategy can assist with reducing the number of damaged interconnect joints formed on a package's pads.

Using a silicon spacer in a package to reduce stress within a package has drawbacks. For example, a silicon spacer can induce interfacial delamination between the die stack and the molding compound at the edge portion of the package. A polyimide layer is added onto the spacer to reduce the interfacial delamination, however, the addition of the polyimide increases the process steps and adds additional costs to semiconductor packaging. Also, a silicon spacer increases the overall size (e.g., z-height, etc.) of a package, which in turn prevents miniaturizing packages. Thus, at least one technique of improving interconnect joint reliability is suboptimal.

BRIEF DESCRIPTION OF THE DRAWINGS

Embodiments described herein are illustrated by way of example and not limitation in the figures of the accompanying drawings, in which like references indicate similar features. Furthermore, in the figures, some conventional details have been omitted so as not to obscure from the inventive concepts described herein.

FIGS. 2A-2E are graphical illustrations of a method of forming a semiconductor package comprising a stress absorption material, in accordance with one embodiment.

DETAILED DESCRIPTION

Figure 1A:
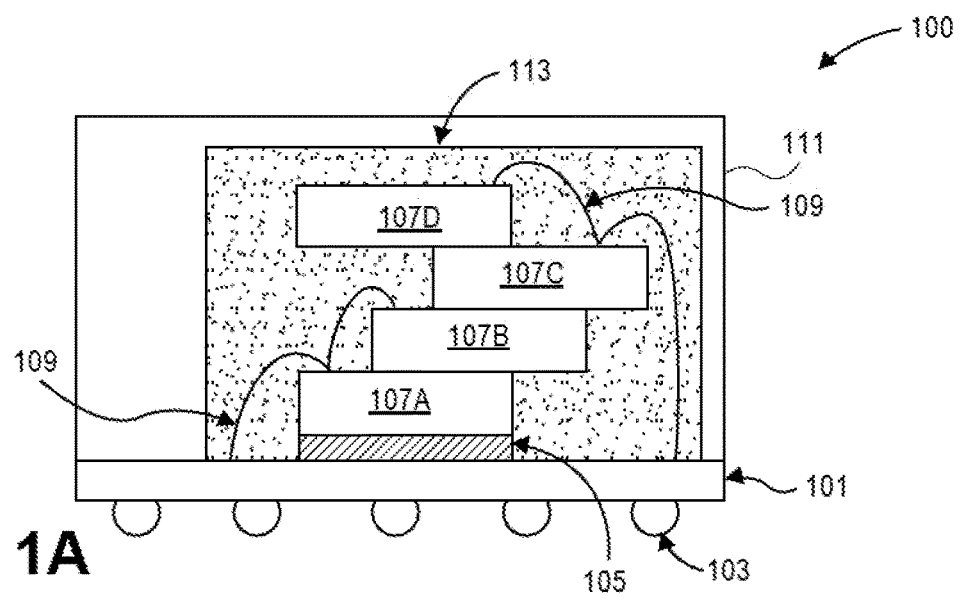
FIGS. 1A-1C are cross sectional side view illustrations of a semiconductor package comprising a stress absorption material, in accordance with one embodiment.

In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein provide techniques for using a stress absorption material to improve solder joint reliability in semiconductor packages and packaged systems. One embodiment of a semiconductor package includes a die on a substrate, where the die has a first surface, a second surface opposite the first surface, and a sidewall surface coupling the first surface to the second surface. The semiconductor package further includes a stress absorption material contacting the sidewall surface of the die and a molding compound separated from the sidewall surface of the die by the stress absorption material. The Young's modulus of the stress absorption material is lower than the Young's modulus of the molding compound. One example of a stress absorption material is a photoresist.

Several advantages are attributable to the embodiments described herein. One advantage is realized by including a stress absorbing material in the package to reduce stress and interfacial delamination, which in turn improves solder joint reliability. For this embodiment, the stress absorbing material encapsulates the die prior to encapsulation by a molding compound. Consequently, the stress absorbing material separates the die from the molding compound. That is, the stress absorbing material acts as a buffer between the die and the molding compound to absorb stress within the package that is caused by CTE mismatches between the die and the molding compound. Reducing the stress can assist with improving solder joint reliability and with reducing interfacial delamination within the package. Another advantage realized by using the stress absorbing material in a package is removal of a silicon spacer from the package. Removing the silicon spacer from a package assists with reducing the size (e.g., z-height, etc.) of the package, which in turn assists with miniaturization of the package. Additionally, removing the silicon spacer can minimize the interfacial delamination caused by distributing stress from a middle portion of a package to an edge portion of the package, which in turn assists with improving solder joint reliability.

Figure 1B:
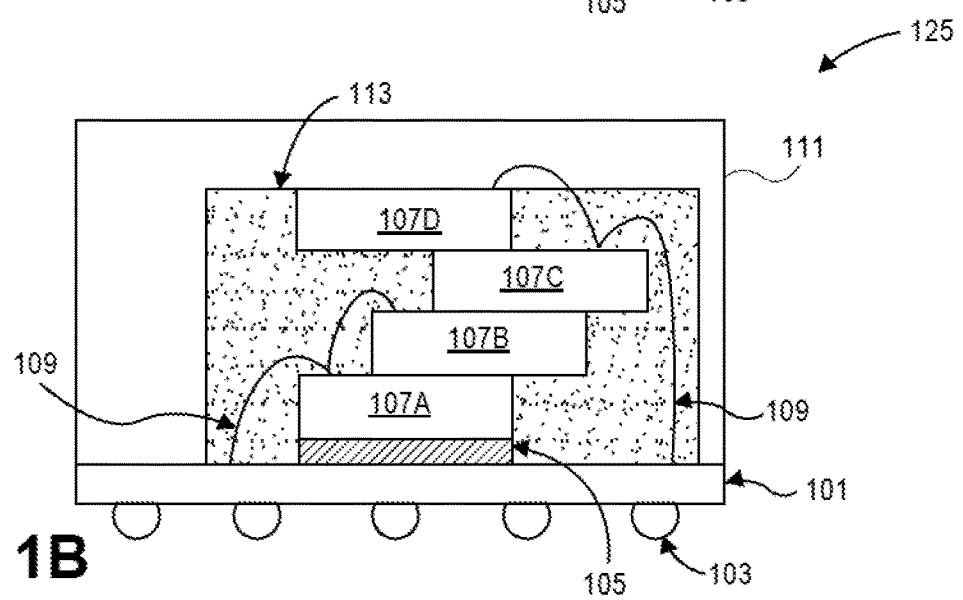
Figure 1C:
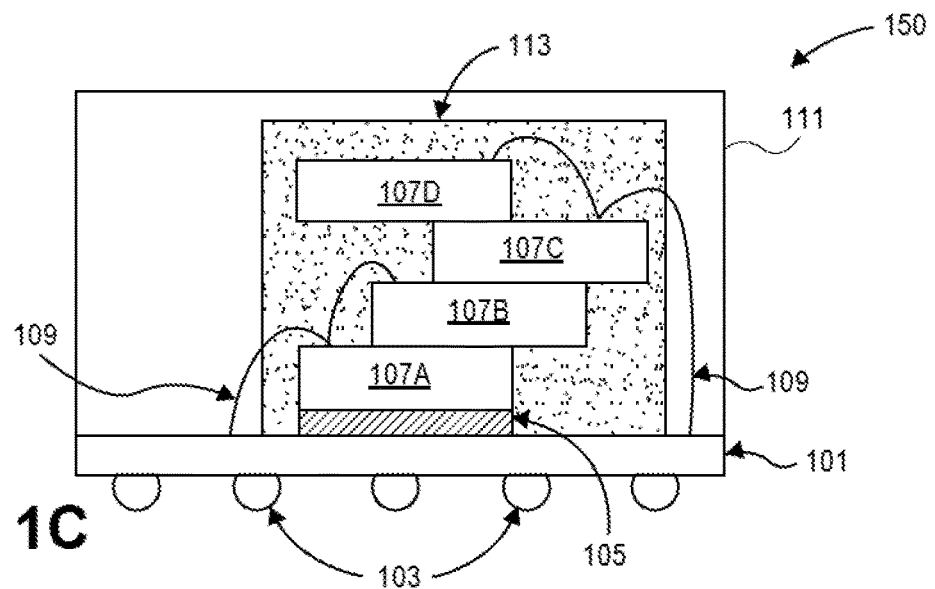

Referring now to FIGS. 1A-1C, cross sectional side view illustrations of semiconductor packages in accordance with embodiments are shown. With specific regard to FIG. 1A, a semiconductor package 100 is shown. The package 100 comprises a substrate 101 with interconnect joints 103 formed on a bottom side of the substrate 101. The substrate 101 can be any known substrate in the art. For example, an organic substrate, an inorganic substrate (e.g., ceramic substrate, silicon substrate, etc.), a combination of an organic substrate and an inorganic substrate, etc. The interconnect joints can be solder bumps, gold bumps, conductive epoxy bumps, copper bumps, column-shaped bumps, spring-type connections, any other suitable interconnect joint known in the art (e.g., a pin grid array, a land grid array, etc.), or any combination thereof.

The package 100 also includes a die attach film 105 on the substrate for attaching a die stack comprised of dies 107A-D to the substrate 101. It is to be appreciated each of the dies 107A-D are attached to other dies 107A-D using die attach films (not shown). The die attach film 105 can be formed from an epoxy adhesive. The package 100 also includes wire bonds 109 for coupling the dies 107A-D to the substrate 101. The wire bonds 109 can be formed from copper or any other suitable conductive materials known in the art. In an embodiment, the dies 107A-D may be offset from each other in order to provide access to the top surface of each of the dies 107A-D to allow for wire bonding from the top surface of the dies 107A-D to the substrate 101.

As shown in FIG. 1A, a stress absorption material 113 encapsulates the dies 107A-D, the die attach film 105, and the wire bonds 109. As used herein, encapsulation does not require all sides/surfaces of a component to be encased by a material. For example, and as shown in FIG. 1A, the material 113 encapsulates lateral sides of the die attach film 105, lateral sides of the dies 107A-D, exposed top sides of the dies 107A-D, and the entirety of the wire bonds 109. Other embodiments, however, are not so limited. For example, and with regard to the package 125 shown in FIG. 1B, the material 113 encapsulates lateral sides of the die attach film 105, lateral sides of the dies 107A-D, exposed top sides of the dies 107A-C, and some portions of the wire bonds 109. As shown, a top surface of the die 107D may not be covered or encapsulated by the material 113. In such embodiments, the top surface of the die 107D may be in direct contact with a portion of a molding compound 111. For another example, and with regard to the package 150 shown in FIG. 1C, the material 113 encapsulates lateral sides of the die attach film 105, lateral sides of the dies 107A-D, exposed top sides of the dies 107A-D, and some portions of the wire bonds 109.

Referring again to FIG. 1A, the stress absorption material 113 can be any material that can be patterned. One example of such a material is a photoresist (e.g., photopolymeric photoresist, photodecomposing photoresist, photocrosslinking photoresist, self-assembled monolayer photoresist, etc.). The package 100 also includes a molding compound 111 that encapsulates the stress absorption material 113. The molding compound 111 can be formed from epoxy resin or any other suitable material known in the art.

As shown in FIG. 1, the stress absorption material 113 separates the molding compound 111 from the dies 107A-D. That is, the material 113 acts as a buffer between the molding compound 111 and the dies 107A-D. The stress absorption material 113, therefore, decouples the molding compound 111 from the dies 107A-D and absorbs stress that results from a CTE mismatch between the molding compound 111 and dies 107A-D. Absorption of the stress by the stress absorption material 113 assists with reducing the amount of stress transferred to an interconnect joint and with minimizing or eliminating the occurrence of delamination within the package. In this way, interconnect joint reliability may be improved. The stress absorption material 113 is able to absorb the stress within the package 100 because the material 113 has a Young's modulus that is lower than a Young's modulus of the molding compound 111. By absorbing the stress, the material 113 also enables fabrication of semiconductor packages that lack spacers and polyimide layers, which in turn reduces costs associated with semiconductor packaging. In one embodiment, the Young's modulus of the stress absorption material 113 is less than or equal to 3 Gigapascals.

Moving on FIGS. 2A-2E, a method of fabricating a semiconductor package 200 comprising a stress absorption material 205 is shown. For one embodiment, the stress absorption material 205 is a photoresist.

With regard now to FIG. 2A, multiple die stacks 201 are placed onto a panel substrate 209. In an embodiment, each die stack 201 comprises multiple dies stacked on one another. A pick and place machine may be used to place the die stacks 201 on the panel substrate 209. The panel substrate 209 may be formed from organic materials, inorganic materials, or any combination thereof. Next, a dispenser 203 is used to apply photoresist 205 onto the die stacks 201 and the panel substrate 209. The photoresist 205 coats the die stacks 201 and the panel substrate 209. Any suitable deposition or application technique may be used to apply the photoresist 205 onto the die stacks 201 and the panel substrate 209. For example, and as shown in FIG. 2A, a spin coating technique 207 may be used to coat the die stacks 201 and the panel substrate 209.

Moving on to FIG. 2B, the application of the photoresist 205 is completed. As shown, the photoresist 205 encapsulates the die stacks 201. That is, the photoresist 205 encapsulates top and lateral sides of the die stacks 201. Next, and as shown in FIG. 2C, the photoresist 205 is patterned. For example, the photoresist 205 may be lithographically patterned. In an embodiment, the patterning of the photoresist 205 results in individual die stacks 201 being encapsulated by distinct portions of the photoresist 205. With regard now to FIG. 2D, a molding compound 211 is used to encapsulate the individual die stacks 201 encased in the photoresist 205. The molding compound 211 may be deposited along sidewalls of the photoresist 205 (i.e., between the die stacks 201). In some embodiments, the molding compound 211 may also be formed over the photoresist 205 and above the die stacks 201. Next, the die stacks are diced. That is, portions of the molding compound and the panel substrate 209 between the die stacks 201 are removed (e.g., with a saw or laser) in order to provide singulated packages 200, as shown in FIG. 2E. In an embodiment, interconnect joints (e.g., solder bumps, etc.) may be attached to bottom sides of the substrate 209s' of the diced die stacks 201 that are encased in the photoresist 205 to form semiconductor packages 200.

Figure 3:
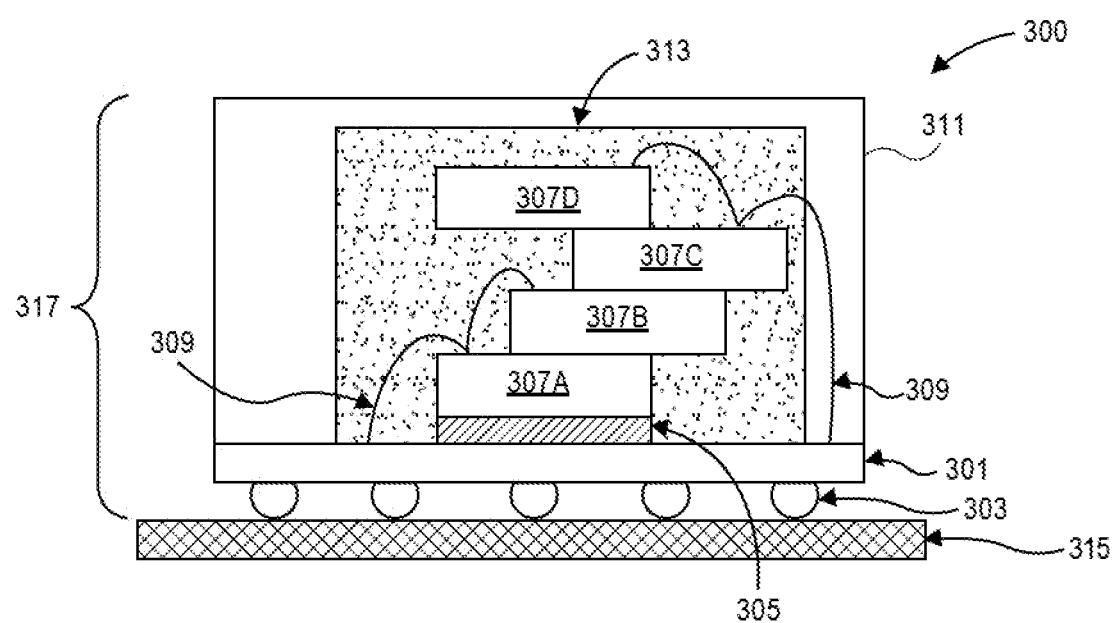
FIG. 3 is a cross sectional side view illustration of packaged system comprising a stress absorption material, in accordance with one embodiment.

FIG. 3 is a cross sectional side view illustration of packaged system 300 comprising a stress absorption material 313, in accordance with one embodiment. In an embodiment, the packaged system 300 may include a semiconductor package 317. The package 317 comprises a substrate 301 that is similar to or the same as the substrate 101 described above in connection with FIG. 1A. The package 317 also comprises a die attach film 305 that is similar to or the same as the die attach film 105 described above in connection with FIG. 1A. The package 317 further comprises a die stack comprised of dies 307A-D that is similar to the die stack 107A-D described above in connection with FIG. 1A. The package 317 also includes wire bonds 309 that are similar to or the same as the wire bonds 109 described above in connection with FIG. 1A. Additionally, the package 317 includes a stress absorption material 313 that is similar to or the same as the stress absorption material 113 described above in connection with FIG. 1A. Also, the package 317 includes a molding compound 311 that is similar to or the same as the molding compound 111 described above in connection with FIG. 1A.

In an embodiment, the packaged system 300 may include the semiconductor package 317 electrically coupled to a board 315 (e.g., a PCB, etc.) with solder bumps 303 and any other suitable interconnect architecture, such as wire bonding, ball grid array, pin grid array, land grid array, or the like.

Figure 4:
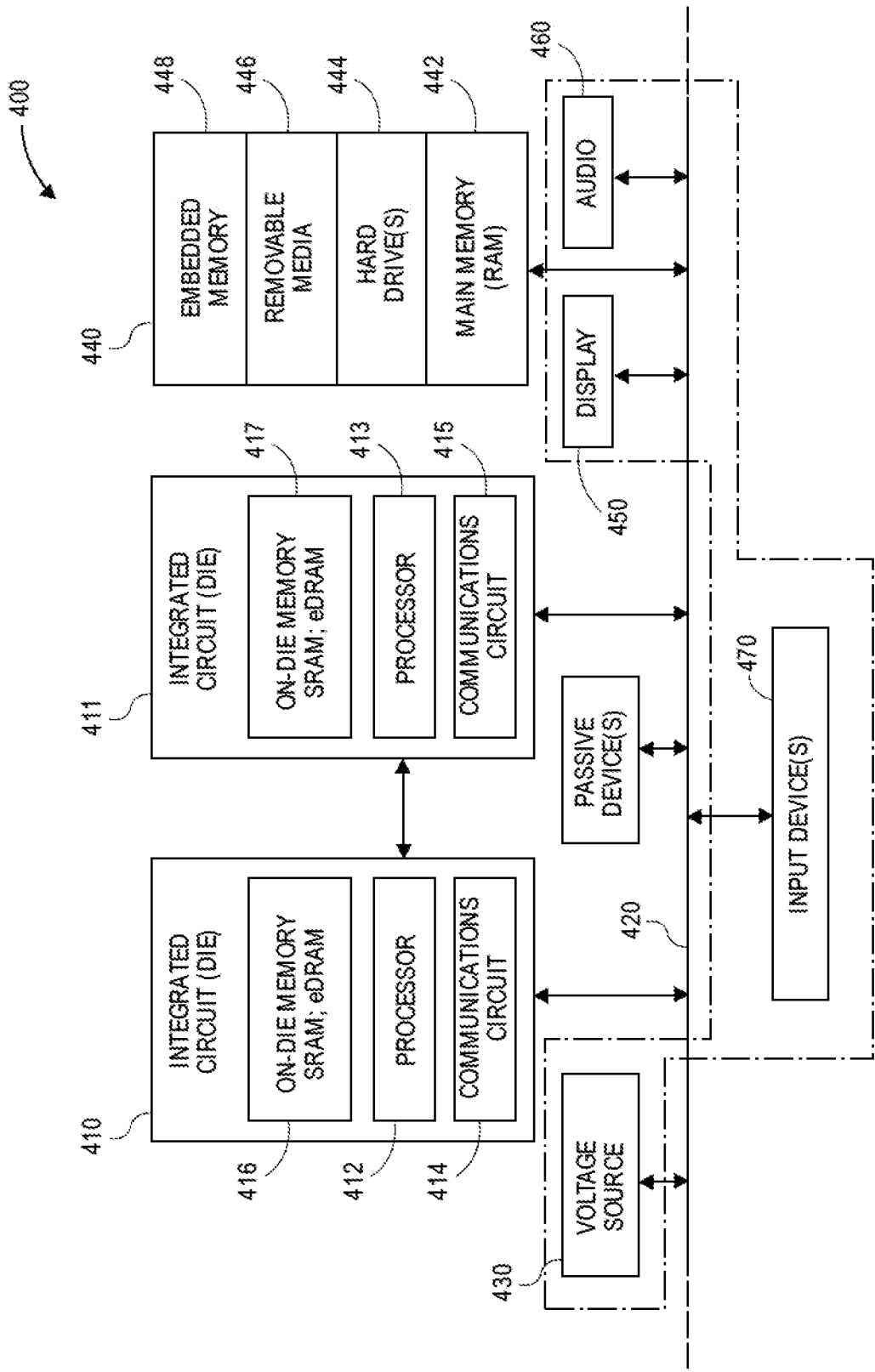
FIG. 4 is a schematic block diagram of a computer system, in accordance with one embodiment.

FIG. 4 illustrates a schematic of computer system 400 according to an embodiment. The computer system 400 (also referred to as an electronic system 400) can include a semiconductor package comprising a stress absorption material in accord with any of the embodiments and their equivalents as set forth in this disclosure. The computer system 400 may be a mobile device, a netbook computer, a wireless smart phone, a desktop computer, a hand-held reader, a server system, a supercomputer, or a high-performance computing system.

The system 400 can be a computer system that includes a system bus 420 to electrically couple the various components of the electronic system 400. The system bus 420 is a single bus or any combination of busses according to various embodiments. The electronic system 400 includes a voltage source 430 that provides power to the integrated circuit 410. In one embodiment, the voltage source 430 supplies current to the integrated circuit 410 through the system bus 420.

The integrated circuit 410 is electrically coupled to the system bus 420 and includes any circuit, or combination of circuits according to an embodiment. In an embodiment, the integrated circuit 410 includes a processor 412. As used herein, the processor 412 may mean any type of circuit such as, but not limited to, a microprocessor, a microcontroller, a graphics processor, a digital signal processor, or another processor. In an embodiment, the processor 412 includes, or is coupled with, a semiconductor package comprising a stress absorption material in accordance with any of the embodiments and their equivalents, as described in the foregoing specification. In an embodiment, SRAM embodiments are found in memory caches of the processor. Other types of circuits that can be included in the integrated circuit 410 are a custom circuit or an application-specific integrated circuit (ASIC), such as a communications circuit 414 for use in wireless devices such as cellular telephones, smart phones, pagers, portable computers, two-way radios, and similar electronic systems, or a communications circuit for servers. In an embodiment, the integrated circuit 410 includes on-die memory 416 such as static random-access memory (SRAM). In an embodiment, the integrated circuit 410 includes embedded on-die memory 416 such as embedded dynamic random-access memory (eDRAM). In one embodiment, the on-die memory 416 may be packaged with a process in accord with any of the embodiments and their equivalents, as described in the foregoing specification.

In an embodiment, the integrated circuit 410 is complemented with a subsequent integrated circuit 411. Useful embodiments include a dual processor 413 and a dual communications circuit 415 and dual on-die memory 417 such as SRAM. In an embodiment, the dual integrated circuit 410 includes embedded on-die memory 417 such as eDRAM.

In an embodiment, the electronic system 400 also includes an external memory 440 that may include one or more memory elements suitable to the particular application, such as a main memory 442 in the form of RAM, one or more hard drives 444, and/or one or more drives that handle removable media 446, such as diskettes, compact disks (CDs), digital variable disks (DVDs), flash memory drives, and other removable media known in the art. The external memory 440 may also be embedded memory 448 such as the first die in a die stack, according to an embodiment.

In an embodiment, the electronic system 400 also includes a display device 450 and an audio output 460. In an embodiment, the electronic system 400 includes an input device such as a controller 470 that may be a keyboard, mouse, trackball, game controller, microphone, voice-recognition device, or any other input device that inputs information into the electronic system 400. In an embodiment, an input device 470 is a camera. In an embodiment, an input device 470 is a digital sound recorder. In an embodiment, an input device 470 is a camera and a digital sound recorder.

At least one of the integrated circuits 410 or 411 can be implemented in a number of different embodiments, including a semiconductor package comprising a stress absorption material as described herein, an electronic system, a computer system, one or more methods of fabricating an integrated circuit, and one or more methods of fabricating semiconductor package comprising a stress absorption material, according to any disclosed embodiments set forth herein and their art-recognized equivalents. The elements, materials, geometries, dimensions, and sequence of operations can all be varied to suit particular I/O coupling requirements including array contact count, array contact configuration for a microelectronic die embedded in a processor mounting substrate according to a semiconductor package comprising a stress absorption material in accordance with any of the disclosed embodiments as set forth herein and their art-recognized equivalents. A foundation substrate may be included, as represented by the dashed line of FIG. 4. Passive devices may also be included, as is also depicted in FIG. 4.

Reference throughout this specification to "one embodiment," "an embodiment," "another embodiment" and their variations means that a particular feature, structure, configuration, or characteristic described in connection with the embodiment is included in at least one embodiment. Thus, the appearances of the phrase "for one embodiment," "In an embodiment," "for another embodiment," "in one embodiment," "in an embodiment," "in another embodiment," or their variations in various places throughout this specification are not necessarily referring to the same embodiment. Furthermore, the particular features, structures, configurations, or characteristics may be combined in any suitable manner in one or more embodiments.

The terms "over," "to," "between," "onto," and "on" as used in the foregoing specification refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

The description provided above in connection with one or more embodiments as described herein that is included as part of a process of forming semiconductor packages may also be used for other types of IC packages and mixed logic-memory package stacks. In addition, the processing sequences may be compatible with both wafer level packages (WLP), and integration with surface mount substrates such as LGA, QFN, and ceramic substrates.

In the foregoing specification, abstract, and/or figures, numerous specific details are set forth, such as specific materials and processing operations, in order to provide a thorough understanding of embodiments described herein. It will, however, be evident that any of the embodiments described herein may be practiced without these specific details. In other instances, well-known features, such as the integrated circuitry of semiconductive dies, are not described in detail in order to not unnecessarily obscure embodiments described herein. Furthermore, it is to be understood that the various embodiments shown in the Figures and described in connection with the Figures are illustrative representations and are not necessarily drawn to scale. Thus, various modifications and/or changes may be made without departing form the broader spirit and scope of the embodiments described in connection with the foregoing specification, abstract, and/or Figures. As used herein, the phrases "A or B", "A and/or B", "one or more of A and B", and "at least one of A or B" means (A), (B), or (A and B).

Embodiments described herein include a semiconductor package, comprising: a die on a substrate, the die having a first surface, a second surface opposite the first surface, and a sidewall surface coupling the first surface to the second surface; a stress absorption material contacting the sidewall surface of the die; and a molding compound separated from the sidewall surface of the die by the stress absorption material.

Additional embodiments include a semiconductor package, wherein a Young's modulus of the stress absorption material is lower than a Young's modulus of the molding compound.

Additional embodiments include a semiconductor package, wherein the Young's modulus of the stress absorption material is less than or equal to 3 Gigapascals.

Additional embodiments include a semiconductor package, wherein the stress absorption material comprises a photoresist material.

Additional embodiments include a semiconductor package, wherein the stress absorption material contacts the second surface of the die.

Additional embodiments include a semiconductor package, further comprising a wire bond electrically coupling the die to the substrate.

Additional embodiments include a semiconductor package, wherein a portion of the wire bond is encapsulated by the molding compound.

Additional embodiments include a semiconductor package, wherein an entirety of the wire bond is encapsulated by the molding compound.

Embodiments described herein include a packaged system, comprising: a semiconductor package on a printed circuit board, the semiconductor package comprising: a die stack on a substrate, wherein the die stack comprises a plurality of dies and wherein two or more of the plurality of dies are offset from each other; a stress absorption material encapsulating the die stack; and a molding compound encapsulating the stress absorption material.

Additional embodiments include a packaged system, wherein a Young's modulus of the stress absorption material is lower than a Young's modulus of the molding compound.

Additional embodiments include a packaged system, wherein the Young's modulus of the stress absorption material is less than or equal to 3 Gigapascals.

Additional embodiments include a packaged system, wherein the stress absorption material comprises a photoresist material.

Additional embodiments include a packaged system, wherein, for each of the plurality of dies, the stress absorption material encapsulates lateral sides of the die.

Additional embodiments include a packaged system, wherein the stress absorption material encapsulates top surfaces of the plurality of dies in the die stack.

Additional embodiments include a packaged system, further comprising wire bonds coupling the plurality of dies to the substrate.

Additional embodiments include a packaged system, wherein, for each wire bond, the stress absorption material encapsulates at least one portion of the wire bond.

Additional embodiments include a packaged system, wherein, for each wire bond, the stress absorption material encapsulates an entirety of the wire bond.

Embodiments described herein include a method, comprising: depositing a plurality of die stacks on a substrate, wherein each die stack comprises a plurality of dies; depositing a stress absorption material on the plurality of die stacks; patterning the stress absorption material such that each die of the plurality of die stacks is encapsulated by the stress absorption material; encapsulating the stress absorption material in a molding compound; and singulating the plurality of die stacks.

Additional embodiments include a method, wherein depositing the stress absorption material comprises spin coating the plurality of dies with the stress absorption material.

Additional embodiments include a method, wherein the stress absorption material comprises a photoresist material.

Additional embodiments include a method, wherein patterning the stress absorption material comprises lithographically patterning the stress absorption material.

Additional embodiments include a method, wherein the substrate is a panel substrate.

Additional embodiments include a method, wherein a pick and place tool is used to deposit the plurality of die stacks on the substrate.

Additional embodiments include a method, wherein sidewalls of the plurality of dies in the plurality of die stacks are separated from the molding compound by the stress absorption material.

Additional embodiments include a method, wherein the stress absorption material encapsulates top surfaces of the plurality of dies in the plurality of die stacks.

The invention claimed is:
1. A semiconductor package, comprising:
  a die on a substrate, the die having a first surface, a second surface opposite the first surface, and a sidewall surface coupling the first surface to the second surface;
  a stress absorption material contacting the sidewall surface of the die;

a molding compound separated from the sidewall surface of the die by the stress absorption material; and a wire bond electrically coupling the die to the substrate, wherein a first portion of the wire bond is in the stress absorption material, and a second portion of the wire bond is in the molding compound.

2. The semiconductor package of claim 1, wherein a Young's modulus of the stress absorption material is lower than a Young's modulus of the molding compound.

3. The semiconductor package of claim 2, wherein the Young's modulus of the stress absorption material is less than or equal to 3 Gigapascals.

4. The semiconductor package of claim 1, wherein the stress absorption material comprises a photoresist material.

5. The semiconductor package of claim 1, wherein the stress absorption material contacts the second surface of the die.

6. A packaged system, comprising:
a semiconductor package on a printed circuit board, the semiconductor package comprising:
- a die stack on a substrate, wherein the die stack comprises a plurality of dies and wherein two or more of the plurality of dies are offset from each other;
- a stress absorption material encapsulating the die stack;
- a molding compound encapsulating the stress absorption material; and
- wire bonds coupling the plurality of dies to the substrate, wherein a first portion of one of the wire bonds is in the stress absorption material, and a second portion of the one of the wire bonds is in the molding compound.

7. The packaged system of claim 6, wherein a Young's modulus of the stress absorption material is lower than a Young's modulus of the molding compound.

8. The packaged system of claim 7, wherein the Young's modulus of the stress absorption material is less than or equal to 3 Gigapascals.

9. The packaged system of claim 6, wherein the stress absorption material comprises a photoresist material.

10. The packaged system of claim 6, wherein, for each of the plurality of dies, the stress absorption material encapsulates lateral sides of the die.

11. The packaged system of claim 6, wherein the stress absorption material encapsulates top surfaces of the plurality of dies in the die stack.

12. A semiconductor package, comprising:
a die on a substrate, the die having a first surface, a second surface opposite the first surface, and a sidewall surface coupling the first surface to the second surface;
a stress absorption material contacting the sidewall surface of the die, wherein the stress absorption material comprises a photoresist material; and
a molding compound separated from the sidewall surface of the die by the stress absorption material.

13. A packaged system, comprising:
a semiconductor package on a printed circuit board, the semiconductor package comprising:
- a die stack on a substrate, wherein the die stack comprises a plurality of dies and wherein two or more of the plurality of dies are offset from each other;
- a stress absorption material encapsulating the die stack, wherein the stress absorption material comprises a photoresist material; and
- a molding compound encapsulating the stress absorption material.

* * * * *